US007800222B2

(12) United States Patent
Schulz et al.

(10) Patent No.: US 7,800,222 B2

(45) Date of Patent: Sep. 21, 2010

(54) SEMICONDUCTOR MODULE WITH SWITCHING COMPONENTS AND DRIVER ELECTRONICS

(75) Inventors: Martin Schulz, Erwitte (DE); Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 11/947,279

(22) Filed: Nov. 29, 2007

(65) Prior Publication Data

US 2009/0140399 A1 Jun. 4, 2009

(51) Int. Cl.
*H01L 23/34* (2006.01)

(52) U.S. Cl. ........................ 257/723; 257/726; 257/727

(58) Field of Classification Search ................. 257/723, 257/726, 727
See application file for complete search history.

(56) References Cited

U.S. PATENT DOCUMENTS

| | | | | |
|---|---|---|---|---|
| 5,444,297 | A * | 8/1995 | Oshima et al. | 257/691 |
| 5,966,291 | A * | 10/1999 | Baumel et al. | 361/707 |
| 6,362,964 | B1 * | 3/2002 | Dubhashi et al. | 361/707 |

* cited by examiner

*Primary Examiner*—Phat X Cao
(74) *Attorney, Agent, or Firm*—Coats & Bennett, P.L.L.C.

(57) ABSTRACT

A semiconductor module comprises at least one semiconductor chip having at least one semiconductor switch. The at least one semiconductor chip is arranged on a carrier substrate. At least one driver component drives the at least one semiconductor switch. The at least one driver component is arranged on a circuit board. The at least one driver component has at least one input for receiving a control signal. The circuit board has a galvanic isolation in a signal path between the at least one driver component and the at least one semiconductor chip.

21 Claims, 8 Drawing Sheets

1
12
28
26
31
32
33
34
22
10
9
29
30
64
65
41
42
43
6
60
5
14
48
8
4
52
51
27
3
13
40
47
7
2
21
17
15
16
25
18
19
20
24
23
49
39

12
32
31
33
56
34
57
43
54
26
25
24
23
28
22
55

6
58
59
61
5
40
14
4
51
3
13
2
60

9
17
17
17
21
16
18
19
20

1
2
3
4
5
6
7
8
9
10
11
12
13
14
16
17
18
19
20
22
23
24
25
26
27
29
30
31
32
33
34
35
36
37
38
39
43
47
49
64
65

SEMICONDUCTOR MODULE WITH SWITCHING COMPONENTS AND DRIVER ELECTRONICS

BACKGROUND

The present invention relates to the field of power semiconductor modules, with switching semiconductor components and the driver electronics necessary for operating the switching semiconductor components.

Power semiconductor modules are typically embodied as standard modules or as IPM ("intelligent power module"). Both types comprise one or a plurality of power semiconductor chips with one semiconductor switch or else with a plurality of semiconductor switches which are connected up to form half-bridges or three-phase bridges ("six packs"). The driver electronics necessary for the operation of the semiconductor switches are already integrated in IPMs. In contrast thereto, the driver circuits in standard modules have to be provided by the user. In both cases, including if IPMs are used, it is necessary, if the module is intended to be connected to external electronic components (e.g. control electronics), for a galvanic isolation between the power semiconductor module and the external electronic components to be provided by the user for safety reasons.

If, as in IPMs, a driver circuit is integrated in the power semiconductor module, then the user has an advantage only when the galvanic isolation of power section, i.e. the chips with the power semiconductor switches, and driver circuit is embodied in such a way that an application-specific microcontroller or a similar controller can be connected directly to the module, without additional galvanically isolating transfer paths having to be provided. However, this would necessitate a reliable galvanic isolation within the semiconductor module, which has not been achieved with conventional IPM components.

The area requirement for the integration of a galvanic isolation would be so large that conventional semiconductor modules with integrated galvanic isolation between power section and driver circuit would attain external dimensions such that they would become unwieldy and unsuitable for practical requirements. Consequently, there is a need for power semiconductor modules with an improved integrated galvanic isolation.

SUMMARY

According to an exemplary embodiment, a semiconductor module comprises at least one semiconductor chip having at least one semiconductor switch. The at least one semiconductor chip is arranged on a carrier substrate. At least one driver component drives the at least one semiconductor switch. The at least one driver component is arranged on a circuit board. The at least one driver component has at least one input for receiving a control signal. The circuit board has a galvanic isolation in a signal path between the at least one driver component and the at least one semiconductor chip.

Of course, the present invention is not limited to the above features and advantages. Those skilled in the art will recognize additional features and advantages upon reading the following detailed description, and upon viewing the accompanying drawings.

BRIEF DESCRIPTION OF THE DRAWINGS

FIG. 3 shows a cross section through a cavity housing.

FIG. 4 shows a cross section through a carrier substrate.

FIG. 5 shows a cross section through the cavity housing in accordance with FIG. 3 after fitting the carrier substrate in accordance with FIG. 4.

FIG. 6 shows a cross section through a circuit board with driver components.

FIG. 7 shows an enlarged cross section through a circuit board.

FIG. 8 shows a cross section through the cavity housing in accordance with FIG. 5 with incorporated circuit board in accordance with FIG. 6 and a heat sink and also a covering prior to assembly to form a semiconductor module.

FIG. 9 shows a cross section through the assembled semiconductor module in accordance with FIG. 8 and an application-specific circuit board for a semiconductor module of this type.

FIG. 10 shows a cross section through the semiconductor module with applied application-specific circuit board.

DETAILED DESCRIPTION

Figure 1:
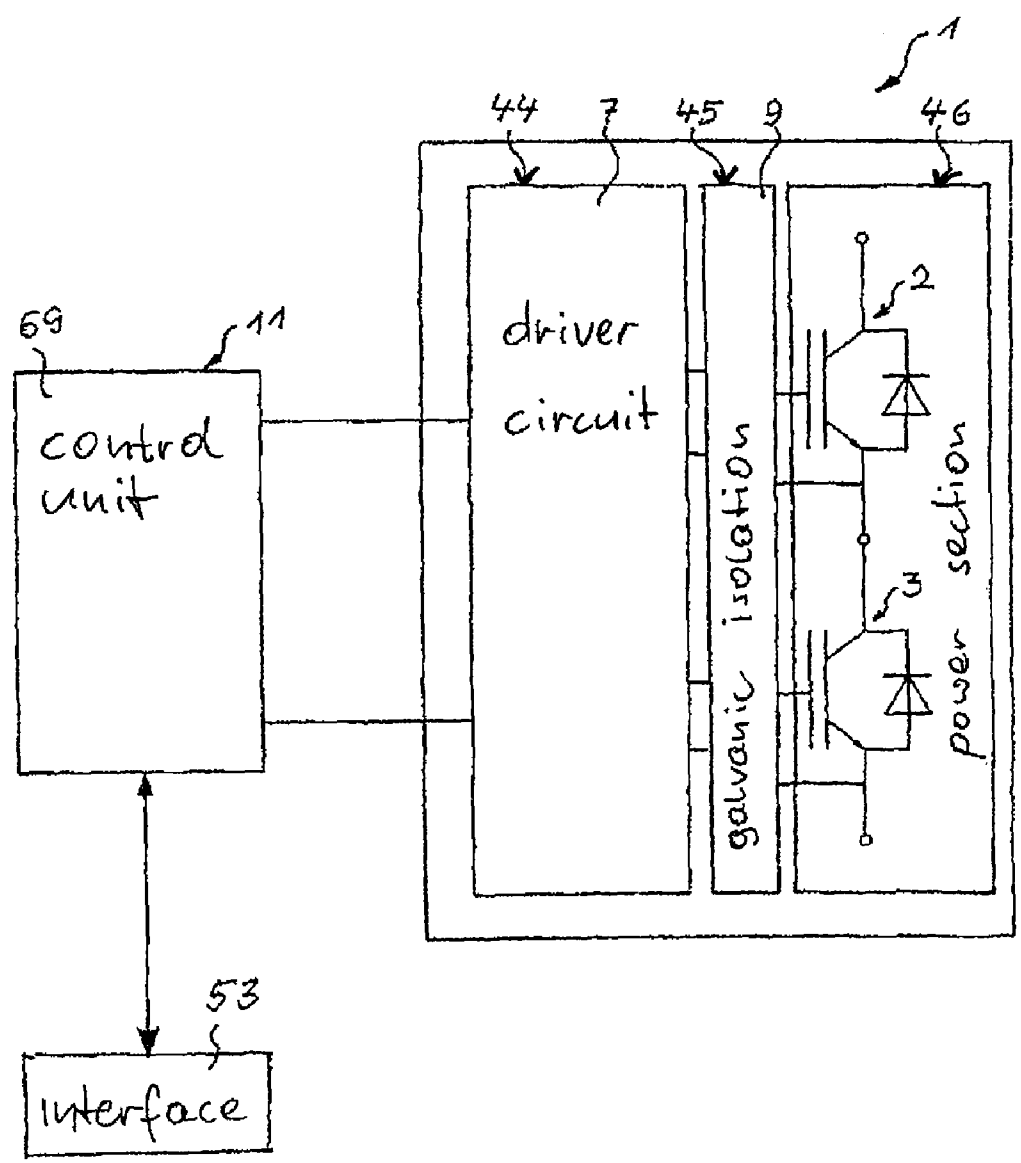
FIG. 1 shows a basic block diagram of a semiconductor module in accordance with one exemplary embodiment of the invention.

FIG. 1 shows a basic block diagram of a power semiconductor module 1 in accordance with one exemplary embodiment of the invention. Three blocks 44, 45 and 46 are arranged in the power semiconductor module 1. In this case, the block 44 has one or a plurality of driver circuits with a driver component 7. The block 45 ensures galvanic isolation between the driver circuit and a power section arranged in block 46. The galvanic isolation (block 45) can be integrated in the driver component 7 or in a circuit board 9, on which the driver component 7 is mounted. The block 46 accommodates the power section, which, in this example, comprises four semiconductor chips 2 and 3 each having a power semiconductor switch, which are connected to form a half-bridge circuit. Furthermore, a free-wheeling diode (not illustrated) can be connected in parallel with each transistor. These free-wheeling diodes can be arranged either in each case in a separate chip or together with the respective transistor in a common chip.

An application-specific circuit board 11 as further circuit block 69 can be connected to the semiconductor module 1. Said circuit block 69 can accommodate, e.g., a microcontroller as a control unit. The application-specific circuit board 11 can interact with an interface 53 of a superordinate electronic device.

Figure 2:
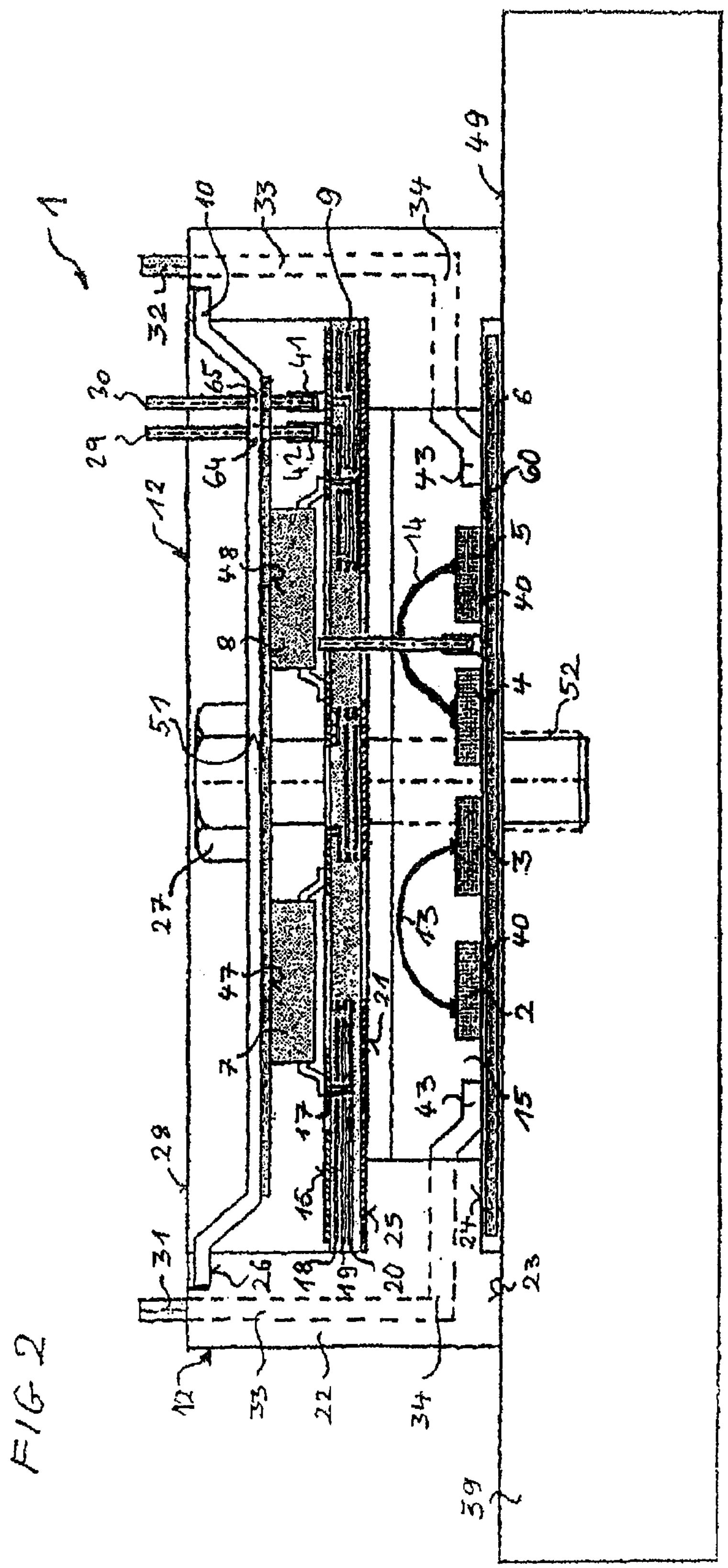
FIG. 2 shows a schematic cross section through a semiconductor module in accordance with the exemplary embodiment of FIG. 1.

FIG. 2 shows a cross section through a semiconductor module 1 in accordance with one exemplary embodiment of the invention. The semiconductor module 1 has at least one semiconductor chip 2 arranged on a carrier substrate 6, e.g. a DCB substrate. In this embodiment of the invention, four semiconductor chips 2, 3, 4 and 5 are applied on the carrier substrate 6, and form a full-bridge circuit. The freewheeling diodes are not illustrated separately in this example. If, as mentioned above, the freewheeling diodes are arranged in separate chips, this results in a total number of eight semiconductor chips in the module.

Furthermore, the semiconductor module 1 has at least one driver component 7 arranged on the circuit board 9. In this example, two driver components 7 and 8 drive in each case a half-bridge, wherein the first half-bridge is formed by the chips 2 and 3 and the second half-bridge is formed by the chips 4 and 5. This circuit arrangement, too, should merely be understood as an example. It is also possible to provide a dedicated driver component for each individual transistor. The circuit board 9 and the DCB substrate 6 are electrically connected to one another by at least one conductive connecting web via which the driver signals (gate signals) generated by the driver components 7, 8 are coupled to the control terminals of the power components.

The semiconductor module 1 can furthermore have a covering 10. The circuit board 9 additionally comprises connecting elements 41 and 42 and contact pins 29, 30 for connecting the circuit board 9 to an application-specific circuit board not shown here (cf. reference symbol 11 in FIG. 1).

The semiconductor module 1 has a housing 12 configured in such a way that the carrier substrate 6 and the circuit board 9 can be arranged one above another. The circuit board 9 has a galvanic isolation between the electrical control terminals provided for the user and the circuit chips 2 to 5 (i.e. the power section). Control signals passed to the driver components 7 and 8 are transferred by means of contactless coupling to the semiconductor chips 2 to 5. For this purpose, either the circuit board 9 has a plurality of electrically conductive wiring layers 18, 19 and 20 which are electrically insulated from one another and which form coreless transformer loops, or the driver components 7 themselves contain a coreless transformer (constructed for example with the aid of planar coils). The coreless transformer of the circuit board 9 or of the driver components 7 and 8 enable a contactless, inductive coupling between the electrical terminals of the module that are accessible to the user and the power semiconductor chips 2 to 5.

The circuit board 9 with the driver components 7 and 8 arranged thereon, said circuit board being arranged above the power section (chips 2 to 5), enables a compact, area-saving construction of the semiconductor module 1. For this purpose, the circuit board 9 can have a patterned metal coating forming conductor tracks on the top side 16. Moreover, the circuit board 9, as mentioned above, has a multilayer lateral wiring with vertical "buried" connecting vias 17 for connecting the wiring layers 18, 19 and 20 to the driver components 7 and 8. In this context, "buried" connecting vias 17 are understood to be vertical connecting lines (vias) which do not form through contacts through the circuit board 9, but rather end on one of the inner wiring layers 18, 19 or 20. Three wiring layers 18, 19 or 20 are provided in the present example. Of course, more or fewer wiring layers can also be provided depending on the requirements of the application.

On account of the buried connecting vias 17, the underside 21 is free of connecting vias and can be provided either with an insulation layer, an electrically conductive layer, a shielding layer or a thermally insulating layer. A thermally insulating layer protects the driver components 7 and 8 against the evolution of heat of the power section of the semiconductor module 1 arranged underneath.

The semiconductor module 1 can be fixed with its carrier substrate 6 on a heat sink 39. For this fixing, the semiconductor module 1 can have a central screw connection 27, for example, which presses the covering 10 onto the module housing. In this case, the heat sink 39 is pressed onto the substrate 6 by its top side 49 by means of the screw connection 27. In addition to the advantages of saving space and area reduction already mentioned above, the semiconductor module 1 has the advantage of simple exchangeability of defective components.

A method for producing a semiconductor module 1 begins with producing a cavity housing 12 with a housing frame 22, wherein the housing frame 22 has a plurality of mounting shoulders 24, 25 and 26. Furthermore, a carrier substrate 6 with at least one power semiconductor chip 2, and in this exemplary embodiment four power semiconductor chips 2, 3, 4 and 5, is produced. Afterward, the carrier substrate 6 is applied to the first, lower mounting shoulder 24 of the housing frame 22 and the power semiconductor chips 2, 3, 4 and 5 are embedded into a soft potting compound 15. When applying the carrier substrate 6 to the first, lower mounting shoulder 24, the supply lines 43 in the form of lead ends are connected to an upper patterned metal layer 60 of the carrier substrate 6 by ultrasonic welding. In addition to ultrasonic welding, soldering or spot or laser welding are also possible as connecting techniques.

A circuit board 9 with driver components 7 and 8 on its top side 16 is furthermore produced. For this purpose, the circuit board 9 is arranged on a second mounting shoulder 25 above the first mounting shoulder 24. Finally, a covering 10 with a central hole 51 is produced and a heat sink 39 having a central threaded hole 52 is provided. The covering 10 can then be applied on an upper, third mounting shoulder 26 above the second mounting shoulder 25.

By means of a screw connection 27 through the central hole 51, which the circuit board 9 and the carrier substrate 6 have as well, the covering 10 is mechanically connected to the threaded hole 52 of the heat sink 39. The screw connection 27 provides for sufficient pressure of the heat sink 39 on the carrier substrate 6. However, the substrate need not necessarily have a hole. Depending on the application, it is also possible for a plurality of substrates to be arranged in the module in such a way that there is space for the screw between them. The frame construction ensures the correct force distribution.

Instead of a central screw connection 27, it is also possible to fix the circuit board 9 and the covering 10 on the shoulders 25 and 26, respectively, of the housing frame 22 by means of corresponding adhesive bonding or soldering methods, but this would make it more difficult to disassemble the semiconductor module or to exchange damaged components.

FIGS. 3 to 10 show cross sections through components during the production of the semiconductor module 1 in accordance with FIG. 2. Components having the same functions as in the previous Figures are identified by the same reference symbols and are not discussed separately.

Figure 3:
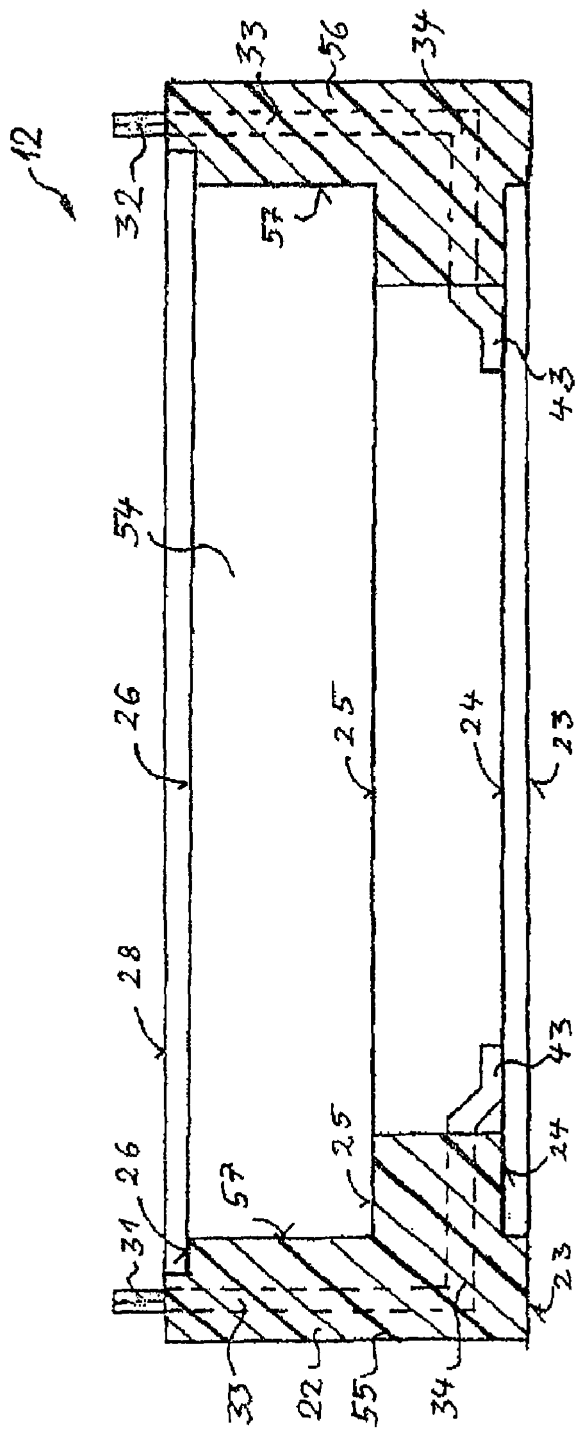
FIGS. 3 to 10 show cross sections through components during the production of the semiconductor module in accordance with FIG. 2.

FIG. 3 shows a cross section through a housing 12. The housing 12 has an interior space 54 surrounded by walls 55 and 56, which form the housing frame 22. An interior wall 57 of the interior space 54 is structured in such a way that three mounting shoulders 24, 25 and 26 are produced, on each of which components of the semiconductor module 1 are arranged.

The material of the housing frame 22 can be a ceramic or a plastic, wherein vertical leads 33 and horizontal or lateral leads 34 are provided within the ceramic or the plastic of the housing frame 22. The vertical leads 33 merge into contact pins 31 and 32 on the upper edge 28 of the housing 12. The lateral or horizontal lines 34 merge into leads 43 of the housing 12 and project into the interior space 54 in the region of the first, lower shoulder 24. A cavity housing 12 of this type can be molded by means of a plastic injection-molding technique or be pressed by means of a ceramic sintering method.

Figure 4:
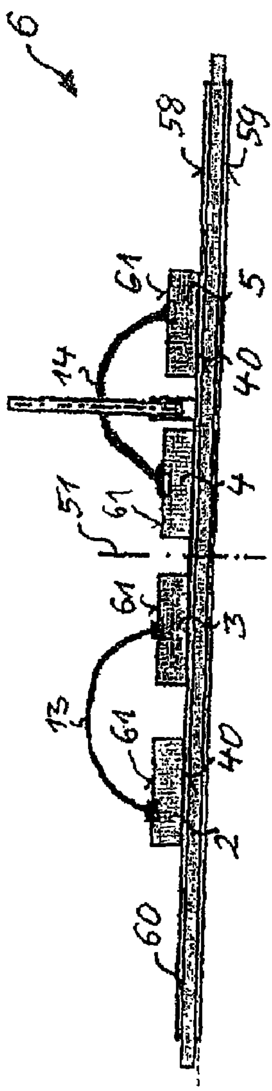

FIG. 4 shows a schematic cross section through a carrier substrate 6 of the semiconductor module 1, wherein the carrier substrate 6 has on its top side 58 a patterned metal coating 60, on which power semiconductor chips 2, 3, 4 and 5 are fixed with their rear sides 40. The carrier substrate 6 can comprise a ceramic or metal plate if particularly high powers are to be switched by the power semiconductor chips 2, 3, 4 and 5. In other cases, the carrier substrate 6 can also have a plastic plate. The rear sides 40 of the power semiconductor chips 2, 3, 4 and 5 can be provided with a rear side coating prior to application to the carrier substrate 6, said coating having a substance from the group aluminum, gold, silver or palladium/gold or alloys thereof. The power semiconductor chips 2, 3, 4 and 5 themselves are produced from a silicon single-crystal wafer in this embodiment of the invention.

In order to achieve a cohesive connection between the power semiconductor chips 2, 3, 4 and 5 and the patterned metal layer 60 of the carrier substrate 6, a die bonding method is often used. For the die bonding method, solder materials can be applied to a solderable surface region of the carrier substrate 6 or to the solderable rear sides 40 of the power semiconductor chips 2 to 5, for example as solder paste.

The patterned metal coating 60 has chip islands for the rear sides 40 of the power semiconductor chips 2, 3, 4 and 5 and contact pads for connecting elements to the top sides 61 of the power semiconductor chips 2, 3, 4 and 5. A patterning of the metal coating 60 on the carrier substrate 6 can be effected by dry or wet etching methods in which a resist mask protects the patterned metal coating 60 to be formed. Finally, such a resist mask is removed after the dry or wet etching method. A resist etching mask of this type is not necessary if the metal coating 60 is patterned by means of a laser beam or by means of printing methods such as screen printing methods, stencil printing methods or jet printing methods.

In this exemplary embodiment of the invention, the power semiconductor chips 2, 3, 4 and 5 are arranged alongside one another on the carrier substrate 6 and form a full-bridge circuit comprising two half-bridge circuits with the power semiconductor chips 2 and 3 and, respectively, 4 and 5. In order to save further space, it is also possible to arrange the half-bridge chips 2 and 3 and, respectively, also the chips 4 and 5 of the second half-bridge circuit compactly in a manner stacked one above another in such a way that a full-bridge circuit comprising half-bridges arranged alongside one another is realized in a very confined space.

Figure 5:
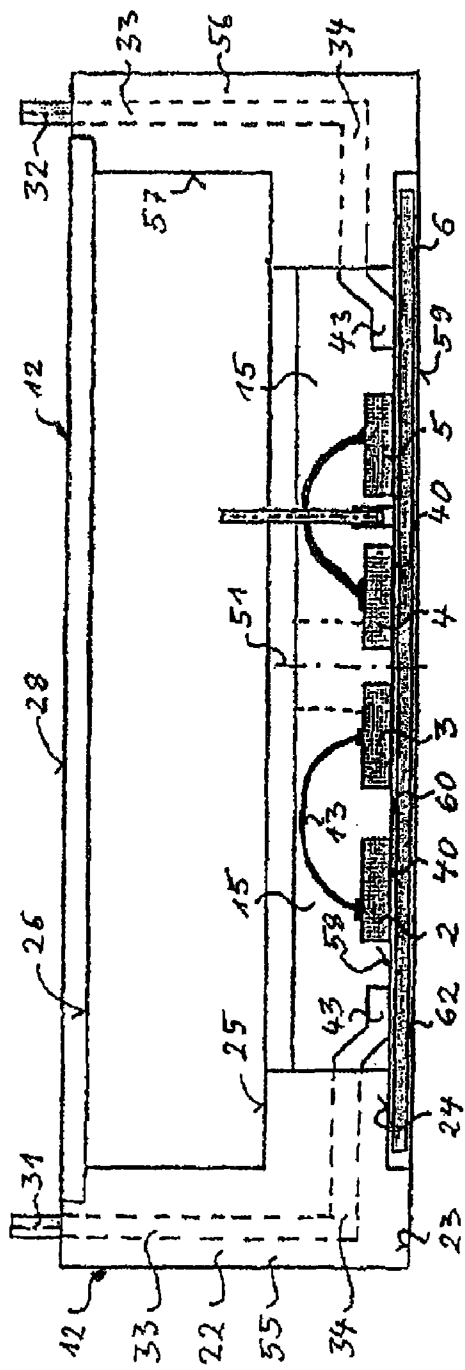

FIG. 5 shows a schematic cross section through the housing 12 in accordance with FIG. 3 after fitting the carrier substrate 6 in accordance with FIG. 4 on the lower, first shoulder 24 of the housing frame 22, such that the underside 59 of the carrier substrate 6 forms a coplanar area with the underside 23 of the housing frame 22. By means of ultrasonic welding (as an alternative also soldering or laser welding), the leads 43 of the housing frame 22 can be electrically and mechanically connected to the metal coating 60 on the top side 58 of the carrier substrate 6. The carrier substrate 6 is thus held on the shoulder 24 of the housing frame 22. In order to improve the thermal transfer, the underside 59 of the carrier substrate 6 can also be provided with a metallic coating 62.

Figure 6:
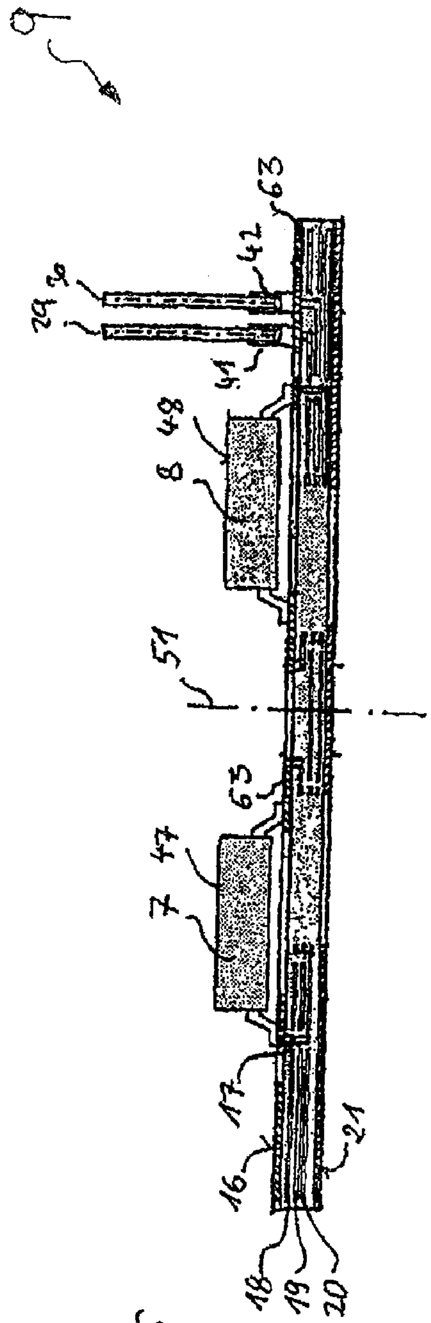

FIG. 6 shows a cross section through a circuit board 9 with driver components 7 and 8. The driver components 7 and 8 are arranged on the circuit board 9 for a respective semiconductor bridge circuit. The circuit board 9 has on its top side 16 a patterned metal coating 63, which can be patterned in an analogous manner to the metal coating 60 of the top side 58 of the carrier substrate 6. Alongside the driver components 7 and 8, connecting elements 41 and 42 are arranged on the top side 16 of the circuit board 9, which connecting elements can be connected via plug connectors 29, 30 to an application-specific circuit board which is described below and which is not shown here.

The underside 21 of the circuit board 9 can have an insulation layer, a patterned metal layer or a thermally insulating layer in order also thermally to isolate the power section of the semiconductor module from the region of the driver components 7 and 8. The circuit board 9 has a plurality of wiring layers 18, 19 and 20, which are insulated from one another and can be electrically connected only by blind connecting vias 17 extending from the top side 16 as far as at most the lower wiring layer 20.

The underside 21 is not reached by such "buried" connecting vias 17. In this case, the wiring layers 18, 19 and 20 can be arranged in a ceramic material or in a plastic material. The metal layers of the wirings 18, 19 and 20 can be configured in such a way that they form coupled planar coils, that is to say a planar coreless transformer, such that control signals of the driver components 7 and 8 can be transferred contactlessly, i.e., in a galvanically isolated fashion, to the power semiconductor chips 2, 3, 4 and 5 of the carrier substrate 6.

Figure 7:
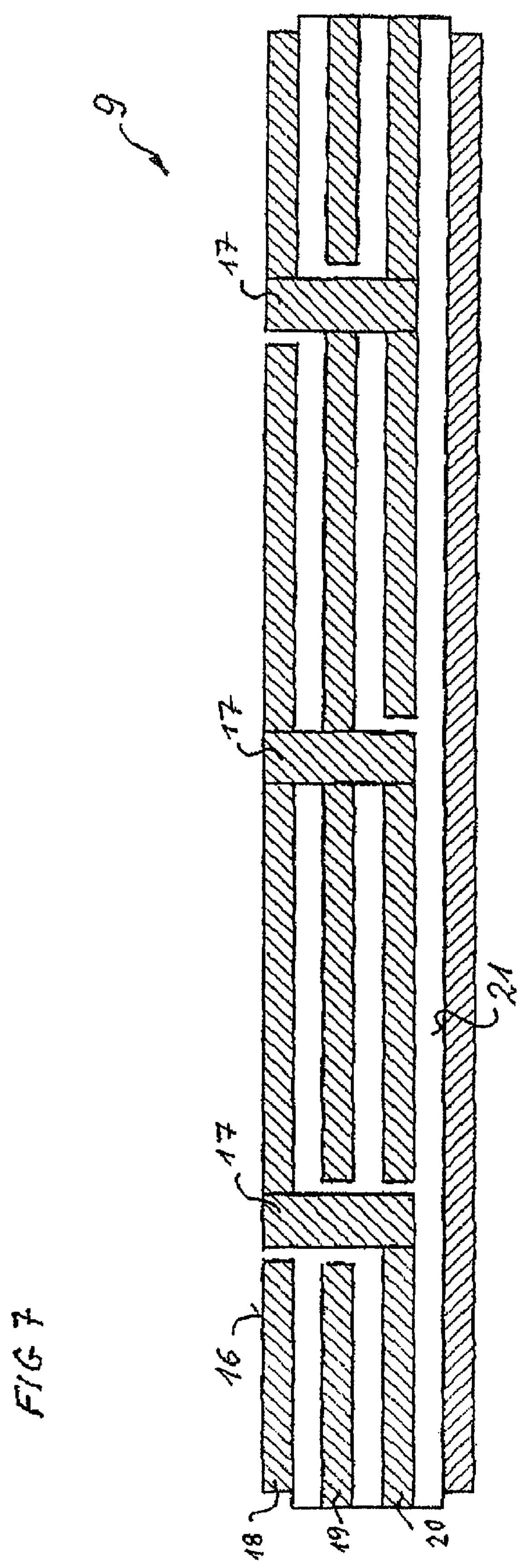

FIG. 7 shows an enlarged cross section through a circuit board 9 with "buried" connecting vias 17 in the vertical direction, which connect the lateral wiring layers 18, 19 and 20 to one another, while the underside 21 of the circuit board 9 is not contact-connected by the vertical buried connecting vias 17.

Figure 8:
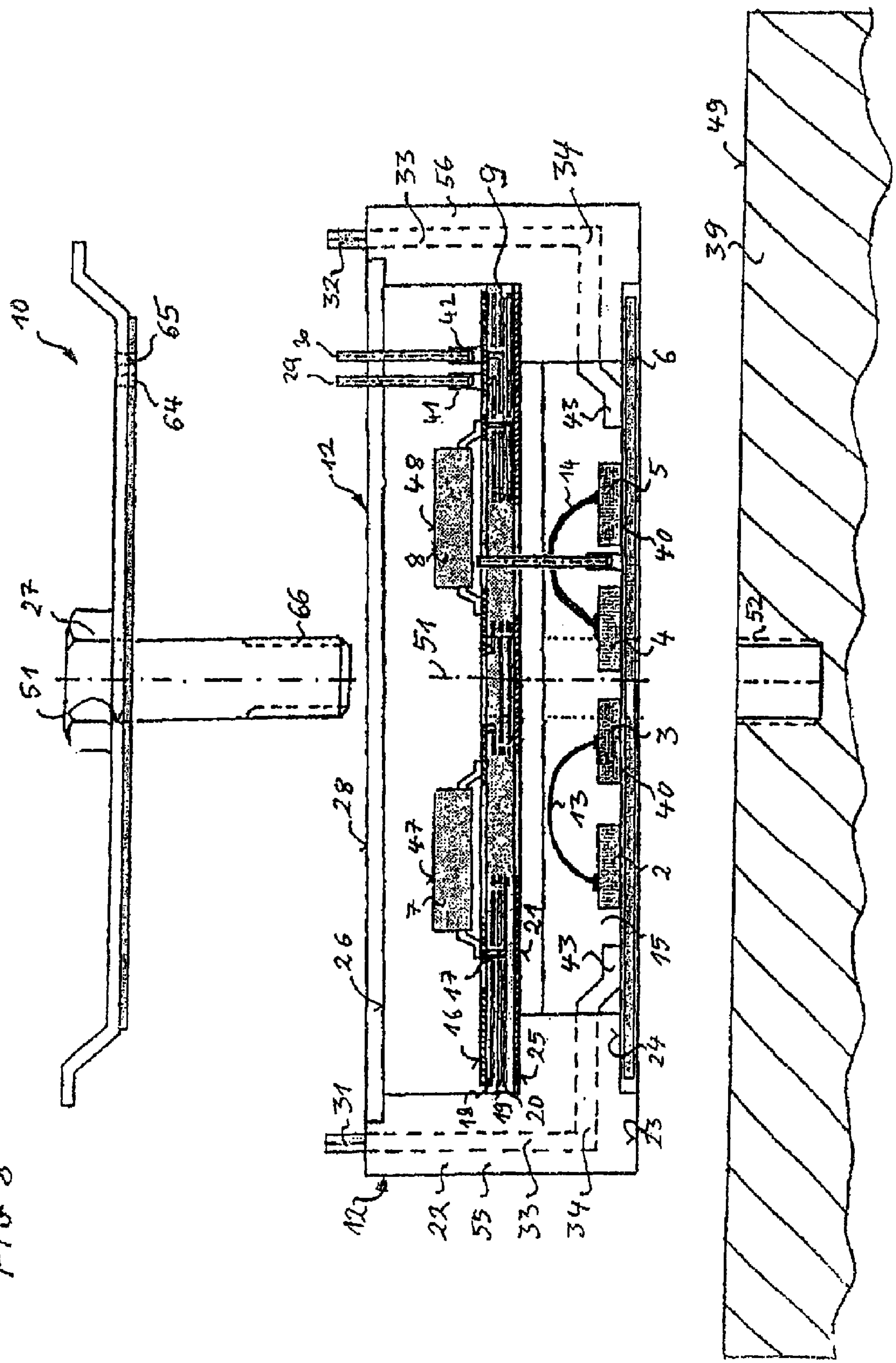

FIG. 8 shows a cross section through the housing 12 in accordance with FIG. 5 with an introduced circuit board 9 in accordance with FIG. 6 and a heat sink 39 and also a covering 10 prior to assembly to form a semiconductor module. In this case, the circuit board 9 is positioned with its underside 21 on the second, central shoulder 25 of the housing frame 22, thereby achieving a galvanic isolation between the power section, which is arranged on the carrier substrate 6, and the control electronics arranged on the top side 16 of the circuit board 9 with the driver components 7 and 8. An electrical connection to an application-specific circuit board is possible via the connecting elements 41 and 42 and the contact pins 29, 30. The covering 10 is dimensioned in such a way that it fits onto an upper shoulder 26 of the housing frame 22.

Finally, the covering 10 has a central hole 51 arranged congruently with respect to a corresponding central hole of the circuit board 9 and the carrier substrate 6. A screw connection 27 is inserted through this central hole 51 in this embodiment of the invention, the thread attachment 66 of said screw connection corresponding to a threaded hole 52 of the heat sink 39. As a result, the substrate 6 is pressed onto the heat sink in the course of mounting. A suitable heat conducting material can be provided between heat sink and module in order to improve the heat dissipation.

Figure 9:
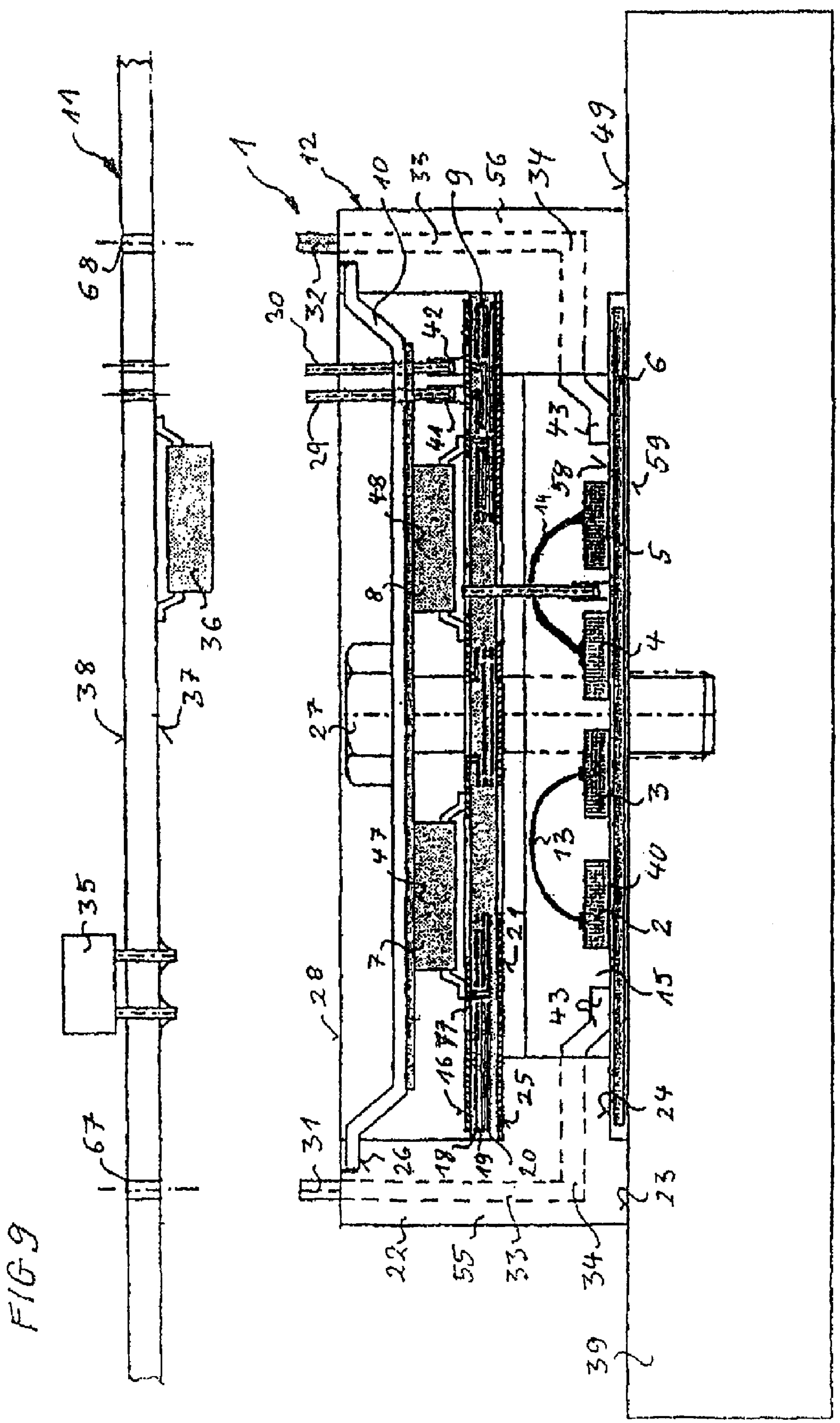

FIG. 9 shows a schematic cross section through the assembled semiconductor module 1 in accordance with FIG. 8 and an application-specific circuit board 11 for such a semiconductor module 1. After the covering 10 has been applied (i.e. adhesively bonded) to the upper mounting shoulder 26 of the housing frame 22, the heat sink 39 can be screwed together with the module and thus be thermally connected by its top side 49 to the underside 59 of the carrier substrate 6.

The heat loss occurring in the power section can therefore be dissipated via the heat sink 39. Moreover, the covering 10 is fixed on the third, upper mounting shoulder 26 of the housing frame 22 in such a way that the through openings 64 and 65 correspond to the connecting elements 41 and 42 on the circuit board 9. The pins 31 and 32 projecting from the upper edge 28 of the housing frame 22 can on the one hand serve as electrical or thermal ("thermal bridge") connection and on the other hand be used as fitting pins.

The application-specific circuit board 11 shown above in FIG. 9 has openings for receiving the contact pins 29 and 30 and thus enabling an electrical connection to the circuit board 9. Moreover, the application-specific circuit board 11 has openings 67 and 68 corresponding to the pins 31 and 32 of the housing frame 22. Both the top side 38 of the application-specific circuit board 11 and the underside 37 can be populated with components 35 and 36, respectively, and perform the controller or control logic functions of the block 47, as illustrated in FIG. 1. For this purpose, the components 35 and 36 can be surface-mountable components. Moreover, the application-specific circuit board 11 can have supply voltage leads and switching pulse leads.

Figure 10:
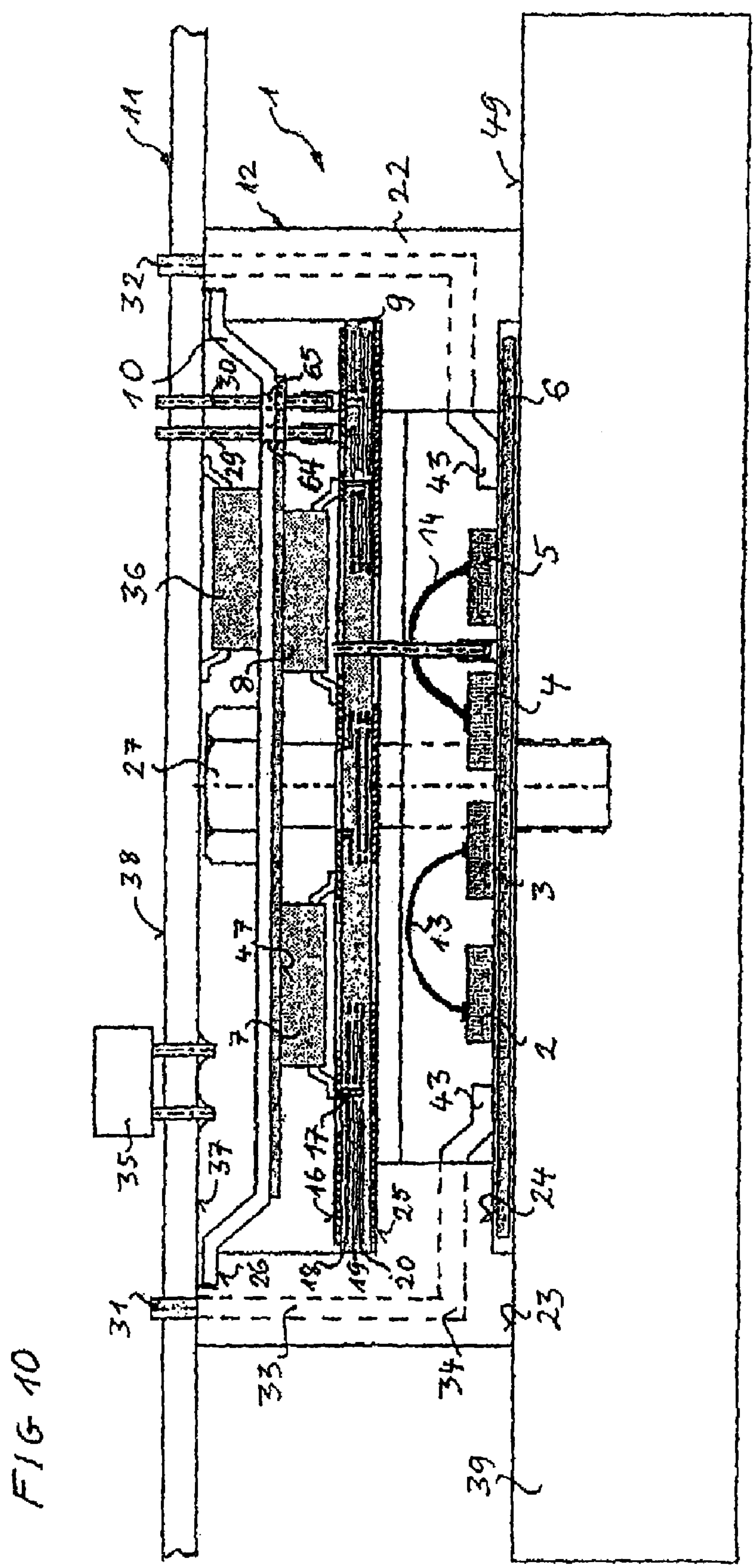

FIG. 10 shows a schematic cross section through the semiconductor module 1 with applied application-specific circuit board 11. For this purpose, the application-specific circuit board 11 is placed with its openings 67 and 68 in an accurately fitting manner onto the pins 31 and 32 of the housing frame 22, such that the contact pins 29 and 30 of the module can simultaneously make contact with the application-specific circuit board 11. The application-specific circuit board 11 can also be provided with interface contacts (not shown) at its edges in order to connect the semiconductor module 1 to a superordinate device.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module, comprising:

at least one semiconductor chip having at least one integrated semiconductor switch;

a carrier substrate, whereon the at last one semiconductor chip is arranged;

at least one driver component for driving the at least one semiconductor switch;

a circuit board, on which the at least one driver component is arranged;

a housing, in which the carrier substrate and the circuit board are arranged one above another; and wherein each driver component has at least one input for receiving a control signal, the circuit board or the at least one driver component has a galvanic isolation in a signal path between the at least one driver component and the semiconductor chip, and the circuit board has an underside free of connecting vias and a top side with multilayer lateral wiring and with vertical buried connecting vias for connecting the wiring layers to the at least one driver component.

2. The semiconductor module as claimed in claim 1, wherein at least one output of the at least one driver component is electrically coupled to a control electrode of the at least one semiconductor switch via a coreless transformer.

3. The semiconductor module as claimed in claim 1, wherein at least one output of the at least one driver component is electrically coupled to a control electrode of the at least one semiconductor switch via optocouplers.

4. The semiconductor module as claimed in claim 1, wherein at least one output of the at least one driver component is capacitively coupled to a control electrode of the at least one semiconductor switch.

5. The semiconductor module as claimed in claim 1, wherein at least one output of the at least one driver component is electrically coupled to a control electrode of the at least one semiconductor switch via piezoelectric couplers.

6. The semiconductor module as claimed in claim 1, wherein at least one output of the at least one driver component is electrically coupled to a control electrode of the at least one semiconductor switch via transformers.

7. The semiconductor module as claimed in claim 1, wherein the underside of the circuit board has at least one of an insulation layer, an electrically conductive layer, a shielding layer, and a thermally insulating layer.

8. The semiconductor module as claimed in claim 1, wherein the housing has a housing frame with a lower shoulder, a central shoulder and an upper shoulder, the carrier substrate being fitted to the lower shoulder, the circuit board being fitted to the central shoulder and a covering being fitted to the upper shoulder.

9. The semiconductor module as claimed in claim 1, wherein the housing has a housing frame with an upper edge on which an application-specific circuit board is arranged.

10. The semiconductor module as claimed in claim 9, wherein the application-specific circuit board is connected to the circuit board via contact pins extending from the circuit board through a covering arranged between the circuit board and the application-specific circuit board.

11. The semiconductor module as claimed in claim 9, wherein the housing frame has pins and lines which electrically connect the application-specific circuit board to the carrier substrate.

12. The semiconductor module as claimed in claim 9, wherein the application-specific circuit board has supply voltage leads and switching pulse lines.

13. The semiconductor module as claimed in claim 1, wherein semiconductor chips of a half-bridge or full-bridge circuit configuration are arranged alongside one another on the carrier substrate.

14. The semiconductor module as claimed in claim 13, wherein the semiconductor chips of the half-bridge circuit configuration are arranged in a manner stacked one above another on the carrier substrate.

15. The semiconductor module as claimed in claim 13, wherein the semiconductor chips of the full-bridge circuit configuration comprise half-bridges arranged alongside one another in a manner stacked one above another in the half-bridges on the carrier substrate.

16. The semiconductor module as claimed in claim 1, wherein the semiconductor module is fixed with its carrier substrate on a heat sink.

17. The semiconductor module as claimed in claim 16, wherein a baseplate of the semiconductor module is arranged between the carrier substrate and the heat sink.

18. The semiconductor module as claimed in claim 16, wherein the semiconductor module is screwed with its carrier substrate onto the heat sink.

19. A semiconductor module, comprising:

at least one semiconductor chip having at least one semiconductor switch;

a carrier substrate, whereon the at least one semiconductor chip is arranged;

at least one driver component for driving the at least one semiconductor switch;

a circuit board, whereon the at least one driver component is arranged; and wherein the at least one driver component has at least one input for receiving a control signal and the circuit board has a galvanic isolation in a signal path between the at least one driver component and the at least one semiconductor chip.

20. The semiconductor module of claim 19, wherein the galvanic isolation comprises a multilayer lateral wiring arranged on a top side of the circuit board, the multilayer lateral wiring comprises vertical buried vias for connecting wiring layers to the at last one driver component.

21. The semiconductor module of claim 20, wherein an underside of the circuit board is free of connecting vias.

* * * * *